United States Patent

Padmapani et al.

[11] Patent Number: 5,877,090
[45] Date of Patent: Mar. 2, 1999

[54] SELECTIVE PLASMA ETCHING OF SILICON NITRIDE IN PRESENCE OF SILICON OR SILICON OXIDES USING MIXTURE OF $NH_3$ OR $SF_6$ AND HBR AND $N_2$

[75] Inventors: Nallan C. Padmapani, Sunnyvale; Terry Ko, South San Francisco, both of Calif.

[73] Assignee: Applied Materials, Inc., Santa Clara, Calif.

[21] Appl. No.: 868,061

[22] Filed: Jun. 3, 1997

[51] Int. Cl.[6] ........................................... H01L 21/00
[52] U.S. Cl. ..................... 438/714; 156/345; 216/67; 252/79.1; 438/724; 438/738; 438/744
[58] Field of Search ........................ 438/714, 724, 438/735, 738, 744; 216/67; 252/79.1; 156/345 P

[56] References Cited

U.S. PATENT DOCUMENTS

| | | | |
|---|---|---|---|
| 4,717,447 | 1/1988 | Dieleman et al. | 156/643 |
| 4,793,897 | 12/1988 | Dunfield et al. | 156/643 |
| 4,820,378 | 4/1989 | Loewenstein | 156/643 |
| 4,857,140 | 8/1989 | Loewenstein | 438/724 |
| 5,318,668 | 6/1994 | Tamaki et al. | 156/662 |
| 5,338,395 | 8/1994 | Keller et al. | 438/724 X |
| 5,387,312 | 2/1995 | Keller et al. | . |
| 5,413,670 | 5/1995 | Langan et al. | 134/1.2 |
| 5,431,772 | 7/1995 | Babie et al. | 156/643.1 |

FOREIGN PATENT DOCUMENTS

| | | |
|---|---|---|
| 0 658 928 A1 | 6/1995 | European Pat. Off. . |
| 3714144 A1 | 12/1987 | Germany . |
| 56-021330 | 2/1981 | Japan . |

OTHER PUBLICATIONS

Lee M. Loewenstein, Selective etching of silicon nitride using remote plasmas of $CF_4$ and $SF_6$, May/Jun. 1989 J. Vac. Sci. Technol. A7(3), pp. 686–690.

Primary Examiner—William Powell
Attorney, Agent, or Firm—Peter J. Sgarbossa

[57] ABSTRACT

An RIE method and apparatus provides uniform and selective etching through silicon nitride material of a supplied workpiece such as a silicon wafer having silicon oxide adjacent to the SiN. A plasma-maintaining gas that includes $N_2$ having an inflow rate of at least 10 sccm is used to provide etch-depth uniformity across the workpiece. The plasma-maintaining gas further includes HBr and one or both of $NF_3$ and $SF_6$.

14 Claims, 9 Drawing Sheets

$NF_3/HBr/N_2$ Etch Rate

SF$_6$/HBr/N$_2$ Etch Rate

SF$_6$/HBr/N$_2$ Selectivity

NF$_3$/HBr/N$_2$ Uniformity $SF_6$/HBr/$N_2$ Uniformity

Process:
200mT, 120W, 30G,
45NF$_3$, 40°C
with:

a) 0 HBr, 0 N$_2$ b) 20 HBr, 0 N$_2$ c) 0 HBr, 40 N$_2$

SELECTIVE PLASMA ETCHING OF SILICON NITRIDE IN PRESENCE OF SILICON OR SILICON OXIDES USING MIXTURE OF NH₃ OR SF₆ AND HBR AND N₂

BACKGROUND

FIELD OF THE INVENTION

The invention is generally directed to plasma etching of silicon nitrides. The invention is more specifically directed to reactive ion etching (RIE) selectively of silicon nitride (SiN) in the presence of silicon or silicon oxide using a plasma containing a halogen such as fluorine (F) or bromine (Br), and hydrogen (H).

CROSS REFERENCE TO U.S. PATENTS

The following U.S. patents are cited by way of reference:
- (A) U.S. Pat. No. 5,431,772 issued Jul. 11, 1995 to Babie et al and entitled "Selective Silicon Nitride Etching Process";
- (B) U.S. Pat. No. 5,413,670 issued May 9, 1995 to Langan et al and entitled "Method for Plasma Etching or Cleaning with Diluted NF₃";
- (C) U.S. Pat. No. 5,318,668 issued Jul. 7, 1994 to Tamaki et al and entitled "Dry Etching Method";
- (D) U.S. Pat. No. 4,717,447 issued Jan. 5, 1988 to Dieleman et al and entitled "Method for Manufacturing a Semiconductor Device by Means of Plasma Etching".

CROSS REFERENCE TO OTHER PUBLICATIONS

The following other publications are cited by way of reference:
- (A) L. M. Lowenstein, "Selective etching of silicon nitride using remote plasmas of $CF_4$ and $SF_6$", J. Vac. Sci. Technol. A, Vol 7, No. 3, May/June 1989, pgs 686–690; and
- (B) EPO publication 0_658_928_A1 June 1995, "Method of plasma etching silicon dioxide selectively to silicon nitride and polysilicon", by M. S. Barnes (IBM);
- (C) DE 3,714,144 A1 (German application of Henkel et al);
- (D) JP 2-271614 A (Japan application 1990).

DESCRIPTION OF RELATED ART

During the manufacture of miniaturized devices such as integrated circuits (IC's) and the like, intermediate and/or final structures are often formed with combinations of patterned materials defined thereon where the combinations are composed of oxides of silicon and nitrides of silicon disposed adjacent to one another. The oxides and nitrides may be further disposed adjacent to monocrystalline, polycrystalline or other forms of silicon.

It is often desirable to strip away or otherwise etch the silicon nitride material while not significantly etching into adjacent silicon or silicon oxide.

In commercial settings, the following parameters are usually considered important for mass-production stripping or etching of silicon nitride:
(1) etch rate of the silicon nitride (typically measured in Angstroms per minute or 'Å/min');

(2) selectivity for removal of silicon nitride over removal of silicon oxide or silicon (typically measured as the ratio of the respective etch rates for these materials);
(3) cross-wafer uniformity of etch depth in the silicon nitride layer (typically measured as a percentage of deviation);
(4) cross-wafer uniformity of etch depth, if any, in the silicon oxide layer; and
(5) good step profile.

In the past, silicon nitride was selectively removed by way of wet etching with phosphoric acid. Wet etching suffers from drawbacks such as: mask undercutting due to isotropic nature of the etch; difficulty of filtering out unwanted particles from the viscous etch liquid; high cost of disposing of wet waste material; process control problems relating to variations in concentration of $H_3PO_4$ in the wet etch solutions over time; contamination problems; and problems associated with the high cost and low reliability of transferring wafers from wet etch baths to subsequent dry process stations.

As a result of such drawbacks, a number of workers in the field have begun to use dry plasma etching of silicon nitride instead of wet etching. Dry plasma etching often uses disassociated radicals of fluorine or of other halogens for etching quickly through the otherwise difficult-to-cut silicon nitride material.

Unfortunately, fluorine and other like halogen radicals are not highly selective and tend to etch even more quickly through adjacent silicon (Si) and silicon oxide (SiO) rather than through the silicon nitride (SiN).

A variety of methods have been tried with limited success for achieving selective etching of silicon nitride and for simultaneously realizing commercially acceptable balances between desirable results such as: (1) high silicon nitride etch rate, (2) high selectivity for silicon nitride over silicon oxide and/or over silicon, (3) good cross-wafer uniformity of etch depth in the silicon nitride layer, (4) good process repeatability, (5) low process costs, and so forth.

The present application discloses an improved method and system for selective plasma etching of silicon nitrides in the presence of silicon or silicon oxides using a plasma that among other things, contains a halogen such as fluorine (F) and/or bromine (Br), and hydrogen (H).

SUMMARY OF THE INVENTION

In accordance with a first aspect of the invention, one or both of the gaseous compounds, $NH_3$ and $SF_6$ is used in combination with HBr (hydrogen bromide) and $N_2$ (nitrogen) to create a plasma. The produced plasma is coupled to a wafer or other like workpiece that has exposed silicon nitride adjacent to exposed silicon oxide and/or to exposed silicon. Chemical and/or physical actions of the produced plasma are used for selectively removing the silicon nitride. The inclusion of a substantial inflow of $N_2$ (nitrogen) within the gases that feed the plasma is believed to improve cross-wafer uniformity of etch depth into the silicon nitride thereby providing more repeatable cross-wafer etch results without fear of excessive over etching into a lower layer.

In accordance with a second aspect of the invention, the gas flows that feed the plasma with one or more of the ($NH_3$ or $SF_6$) and HBr and $N_2$ input gases are adjusted to correspond to an allowed maximum level of cross-wafer etch deviation thereby assuring a corresponding level of cross-wafer etch uniformity. It has been found that the relative inflow of $N_2$ affects cross-wafer etch uniformity even though it had been previously thought that $N_2$ does not play a significant part in the nitride etching process. It is shown here that cross-wafer uniformity of nitride etching improves with increased inflow of $N_2$ and a desired level of cross-wafer etch uniformity can be realized by appropriate adjustment of the $N_2$ inflow rate.

In accordance with a third aspect of the invention, selective plasma etching of silicon nitride is tailored to preferentially use $SF_6$ rather than $NF_3$ in the plasma feeding recipe when anisotropic etching (with less mask undercutting and sharper step profiles) is desired. Conversely, selective plasma etching of silicon nitride is tailored to preferentially use $NF_3$ rather than $SF_6$ in the plasma feeding recipe when greater selectivity is desired in place of sharper step profiles or less mask undercutting.

More specifically, in one RIE system in accordance with the invention, the following recipe ranges have been found to be particularly advantageous:

| | Flow rate (sccm) |
|---|---|
| Input gas | |
| HBr | 5–25 |
| $SF_6$ | 60–100 |
| $N_2$ | 20 or greater (to achieve cross-wafer etch rate uniformity of $1\sigma = 9\%$ or better) |
| Chamber conditions | |
| RF Input Power | 100–300 W (Use lower end for better selectivity, higher end for sharper step profiles) |
| RF frequency: | 13.5 MHZ |
| Pressure: | 20–300 mTorr (Use lower end for sharper step profiles, higher end for better selectivity) |
| Wafer temperature: | 20–80° C. |
| Wafer backside pressure: | 4–8 Torr |

In a second RIE system in accordance with the invention, the following recipe ranges have been found to be particularly advantageous:

| | Flow rate (sccm) |
|---|---|
| Input gas | |
| HBr | 25–45 |
| $NF_3$ | 60–90 |
| $N_2$ | 10 or greater (to achieve cross-wafer etch rate uniformity of $1\sigma = 6\%$ or better) |
| Chamber conditions | |
| RF Input Power | 100–300 W (Use lower end for better selectivity, higher end for sharper step profiles) |
| RF frequency: | 13.5 MHZ |
| Pressure: | 20–300 mTorr (Use lower end for sharper step profiles, higher end for better selectivity) |
| Wafer temperature: | less than 100° C. |
| Wafer backside pressure: | 10 Torr |

Other aspects of the invention will become apparent from the below detailed description.

BRIEF DESCRIPTION OF THE DRAWINGS

The invention will be described with reference to the following drawing(s) in which.

DETAILED DESCRIPTION

Figure 1:
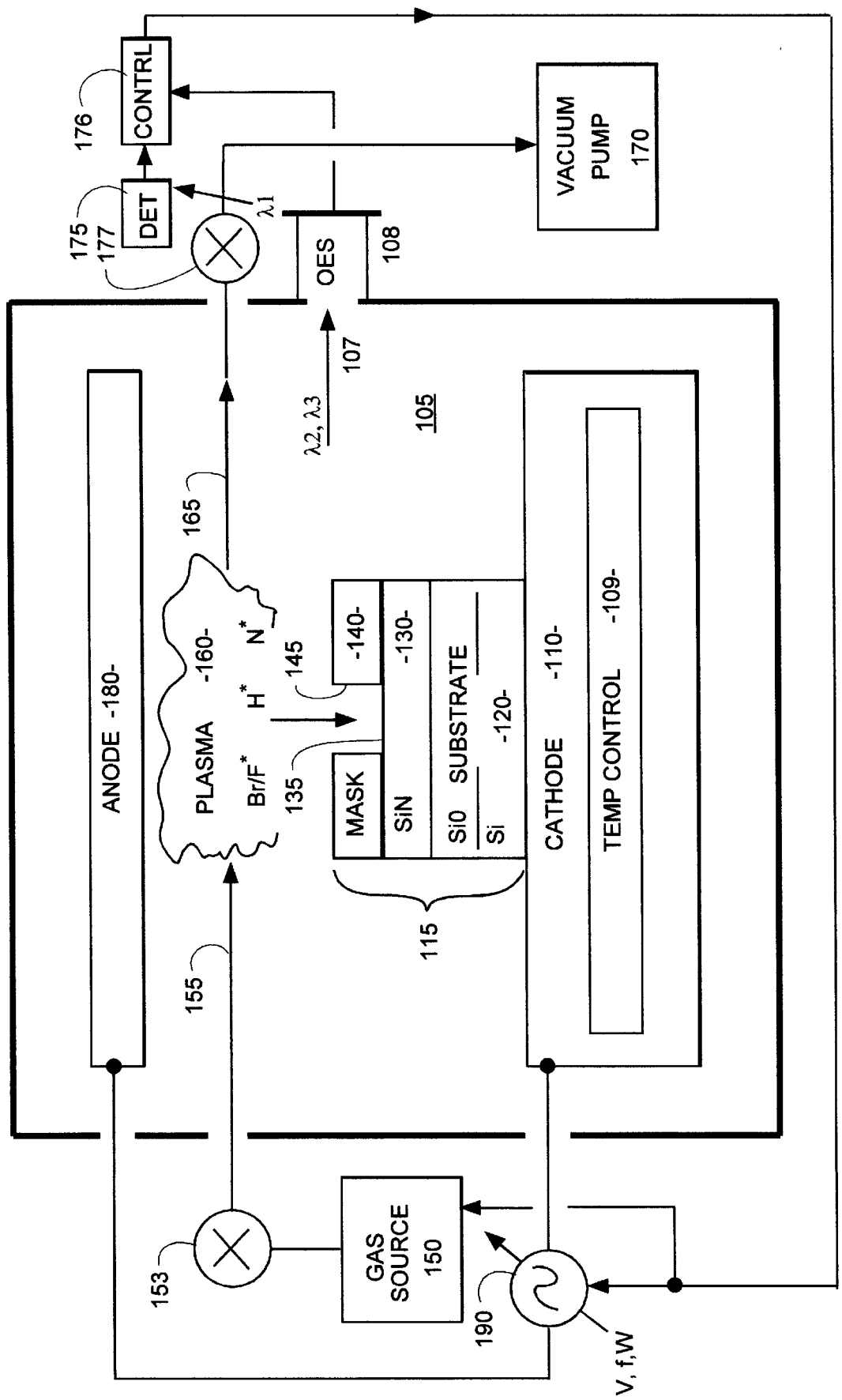
FIG. 1 is a cross-sectional schematic of a reactive ion etching (RIE) system for carrying out a dry etch process in accordance with the invention.

FIG. 1 schematically shows in cross-section a reactive ion etch system 100 in accordance with the invention.

System 100 includes a workpiece-supporting cathode 110 for supporting workpiece 115. Cathode 110 is spaced-apart from an opposed anode 180 within a low-pressure chamber 105. Anode 180 may be a discrete element as shown or it may defined by one or more of the inner walls of the plasma chamber 105 rather than being a separate element. In one embodiment, the chamber inner walls define the anode and the cathode 110 is placed centrally within the chamber 105 so that multiple faces of the cathode oppose corresponding inner walls of the chamber. The latter embodiment allows for simultaneous etch of two or more workpieces in one chamber.

A electromagnetic energy source (e.g., an EM source such as a radio frequency generator) 190 is operatively coupled to the cathode and anode for producing an electromagnetic (EM) field between the opposed faces of the cathode and anode. The EM field may be of a single frequency (f) or multiple frequencies. Typically a combination is used of approximately 13 MHz for plasma creation and approximately 400 KHz for ion acceleration. The frequency (f), and/or voltage (V) and/or power level (W) of the EM energy source 190 may be each a controllable variable that is controlled by a system control module 176 such as a process control computer. The EM field is used for igniting and maintaining a plasma. Magnetic fields may be additionally provided by biasing magnets (not shown) for confining the formed plasma to a desired vicinity such as that of the to-be-processed workpiece. If desired, the intensity of the biasing magnetic field can also be adjusted.

A gas supply means 150 is operatively coupled to the low-pressure chamber 105 for supplying a selected combination of gases 155 into chamber 105. The selectable gases include, in accordance with the invention, $NH_3$ and/or $SF_6$, and HBr and $N_2$. It is to be understood that selection of the specific inflow gases 155 and the respective rates of flow of each of the inflow gases 155 can be automatically controlled by the system control module 176.

A flow-rate control means (e.g., a set of electrically controlled valves) 153 is provided for regulating the respective inflow rate of each of the selected gases 155 so as to maintain a desired rate of gas inflow. Although not specifically shown, it is to be understood that the flow-rate control means 153 can be operatively coupled to and automatically controlled by the system control module 176. In one embodiment the $N_2$ inflow rate is preferably set at 10 sccm or greater. (10 sccm of $N_2$ is the flow of $N_2$ gas which fills up per minute a volume of 10 cc to a pressure of 1 atm at 0° C.).

A vacuum means 170 is coupled to the low-pressure chamber 105 for evacuating exhaust gases 165 from the chamber 105 and for maintaining a desired low pressure within the chamber 105.

A spectroscopic analyzer means of either the OES kind 108 (Optical Emission Spectroscope) or the exhaust path kind 175 or both is optionally provided for optically determining the etching end point. The spectroscopic analyzer means 108/175 can be coupled to the system control means 176 so as to cause automatic turn off the EM source 190 and thereby automatically halt the etch process when the analyzer means 108/175 and control means 176 in combination determine that effective etch-through has been achieved.

The term 'effective etch-through' is used here to mean the condition when etching has progressed sufficiently far into a silicon nitride portion 130 of the workpiece 115 so that a useable pattern is created in the silicon nitride without leaving behind undesired remnants.

If used, the OES (Optical Emission Spectroscope) 108 is preferably installed approximately in line with the workpiece surface so as to detect plasma induced light emission $\lambda 2$ of nitrogen (N) and/or plasma induced light emission $\lambda 3$ of oxygen (O) in the approximate plane 107 of surface portion 135. The OES 108 is coupled to the etch-control means 176 so as to turn off the EM source 190 and thereby halt the etch process when effective etch-through is indicated to have been reached by an empirically-determined reduction in $\lambda 2$ emissions of N and/or an empirically-determined increase in $\lambda 3$ emissions of O in the approximate plane 107.

A pressure regulating means 177 is provided along the exhaust path of vacuum means 170 for maintaining a desired pressure level within chamber 105. The desired pressure level is preferably at least as low as approximately 200 mTorr, more preferably at least as low as approximately 100 mTorr.

The workpiece 115 includes the to-be-etched silicon nitride material 130. A substrate 120 composed of one or both of silicon oxide (SiO) and silicon (Si) is typically included in the workpiece 115 with one or both of the SiO and Si positioned adjacent to the to-be-etched silicon nitride material 130. The materials of substrate 120 may include one or more materials such as glass ($SiO_2$) or silicon nitride ($Si_3N_4$) or amorphous silicon (a-Si) or poly or monocrystalline silicon (p-Si or Si) or other materials as may be suitable for a specific application. Examples of workpieces 115 include 6 inch, 8 inch, or wider diameters of silicon wafers as used conventionally in the semiconductor device manufacturing industry.

Optionally, a pre-patterned mask 140 that has been formed by photolithography or other suitable means may be provided above the to-be-etched material layer 130. The mask 140 will have one or more apertures such as 145 defined therethrough for exposing a surface portion 135 of the to-be-etched silicon nitride 130. Unexposed portions of material layer 130 are to be protected from etching by the material of the mask 140. Mask 140 may be composed of materials such as photoresist deposited to a thickness of say, 1.5 $\mu$m.

The EM source 190 is activated by etch-control module 176 so as to provide an electromagnetic field between the cathode 110 and anode 180 for etching through the exposed portion of material layer 130 in a single step and stopping after effective etch-through has been achieved.

The frequency (f) of the generated RF field is preferably in the range of approximately 400 KHz to approximately 13.5 MHZ. If desired, the generated RF field may have a combination of multiple frequencies such as both 13.5 MHZ and 400 KHz and these combined multiple frequencies may be developed by separate oscillators. The lower frequency field is often developed so as to predominate in the vicinity of the substrate-supporting cathode 110 and is referred to as the pedestal RF. The higher frequency field is often developed so as to predominate in the vicinity of the plasma 160 above the workpiece 115 and is referred to as the plasma RF.

The power density (W) of the applied RF field is preferably at least around 0.5 watt per centimeter squared (0.5 $W/cm^2$) approximately as measured relative to the exposed surface area 135 of material layer 130 and more preferably, approximately 1 $W/cm^2$ or more. (A typical set up is 300 watts uniformly distributed by magnetic field confinement over the area of an 8 inch diameter wafer.)

The intensity (volts/cm) of the RF field is sufficiently large to disassociate the introduced inflow gas 155 into atomic constituents (free radicals). In one embodiment, field intensity in the range of 300 watts to 700 watts is created in the vicinity of an exposed circular surface portion 135 of material layer 130 having a diameter of approximately 8 inches.

Gas source 150 supplies a steady stream of the reactive gas mixture 155. A reactive gas mixture consisting essentially either of: (a) $NH_3$ and HBr and $N_2$ or of (b) $SF_6$ and HBr and $N_2$ is preferred.

A temperature control means 109 may be provided within or in addition to the workpiece-supporting chuck 110 for maintaining a wafer backside temperature in the range of approximately 20° C. to 100° C. The backside temperature of wafer 115 is more preferably maintained at approximately 60° C. or less.

The wafer-temperature control means can include for example a fluid-cooled heat exchange system such as a backside helium-flow cooling system integrated into the wafer-supporting chuck 110.

Nitride to oxide selectivity is defined as:

$$N/O\_selectivity = \frac{\text{Etch rate of SiN (in Å/minute)}}{\text{Etch rate of SiO (in Å/minute)}}$$

Generally the to-be-etched silicon nitride 130 is positioned immediately adjacent to silicon oxide as shown in FIG. 1 and N/O_selectivity is an important factor to be considered in adjusting process parameters. In some cases, however, sharpness of step profile is also an important factor. Cross wafer uniformity of nitride etch rate is also an important factor. If the SiN layer has reached a state where it is very thin (say 100 Å), and cross wafer uniformity of nitride etch rate is poor, there is a danger that etch-through will occur in some spots before others and that there will be excessive cutting into the underlying layer (e.g., into a gate-insulator defining silicon dioxide layer).

The inflow gas mixture 155 preferably consists of $SF_6$ and HBr and $N_2$ when significantly anisotropic etching (with less mask undercutting and sharper step profiles) is desired. Conversely, the inflow gas mixture 155 preferably consists of $NF_3$ and HBr and $N_2$ when greater N/O_selectivity is desired in place of sharper step profiles or less mask undercutting.

Figure 2:
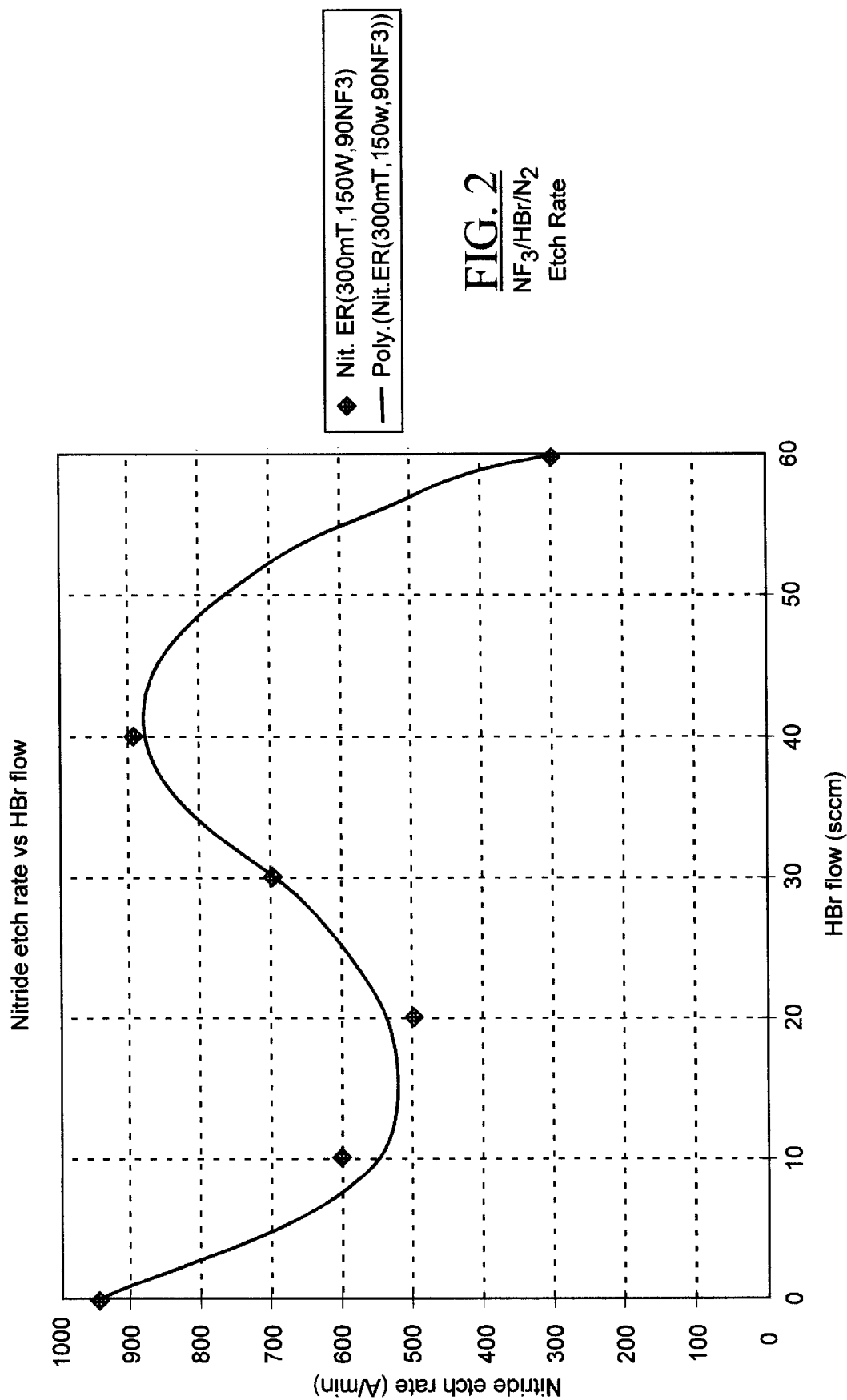
FIG. 2 is a plot showing first experimental results of SiN etch rate over a first range of plasma feed parameters for a $NF_3/HBr/N_2$ input gas recipe.

FIG. 2 is a plot showing first experimental results of SiN etch rate over a first range of plasma feed parameters for a $NF_3/HBr/N_2$ input gas recipe. Chamber pressure was set at 300 mTorr. EM input power was set at 150 Watts. The surface area of the exposed silicon nitride (135) was approximately 325 $cm^2$ thereby providing a power density of roughly 0.5 $W/cm^2$. EM frequency was set at 13.5 MHZ. $NF_3$ inflow rate was fixed at 90 sccm. $N_2$ inflow rate was fixed at 40 sccm. HBr inflow rate was varied over the range 0 to 60 sccm. As seen the two highest nitride etch rates were observed at 0 sccm HBr and 40 sccm HBr. The 0 sccm HBr point is not acceptable because of poor selectivity (see FIG. 4). The range between about 30 sccm HBr and about 40 sccm HBr is preferred because it provides a combination of high selectivity (see FIG. 4) and good nitride etch rate (as seen by overlapping FIGS. 2 and 4).

Figure 3:
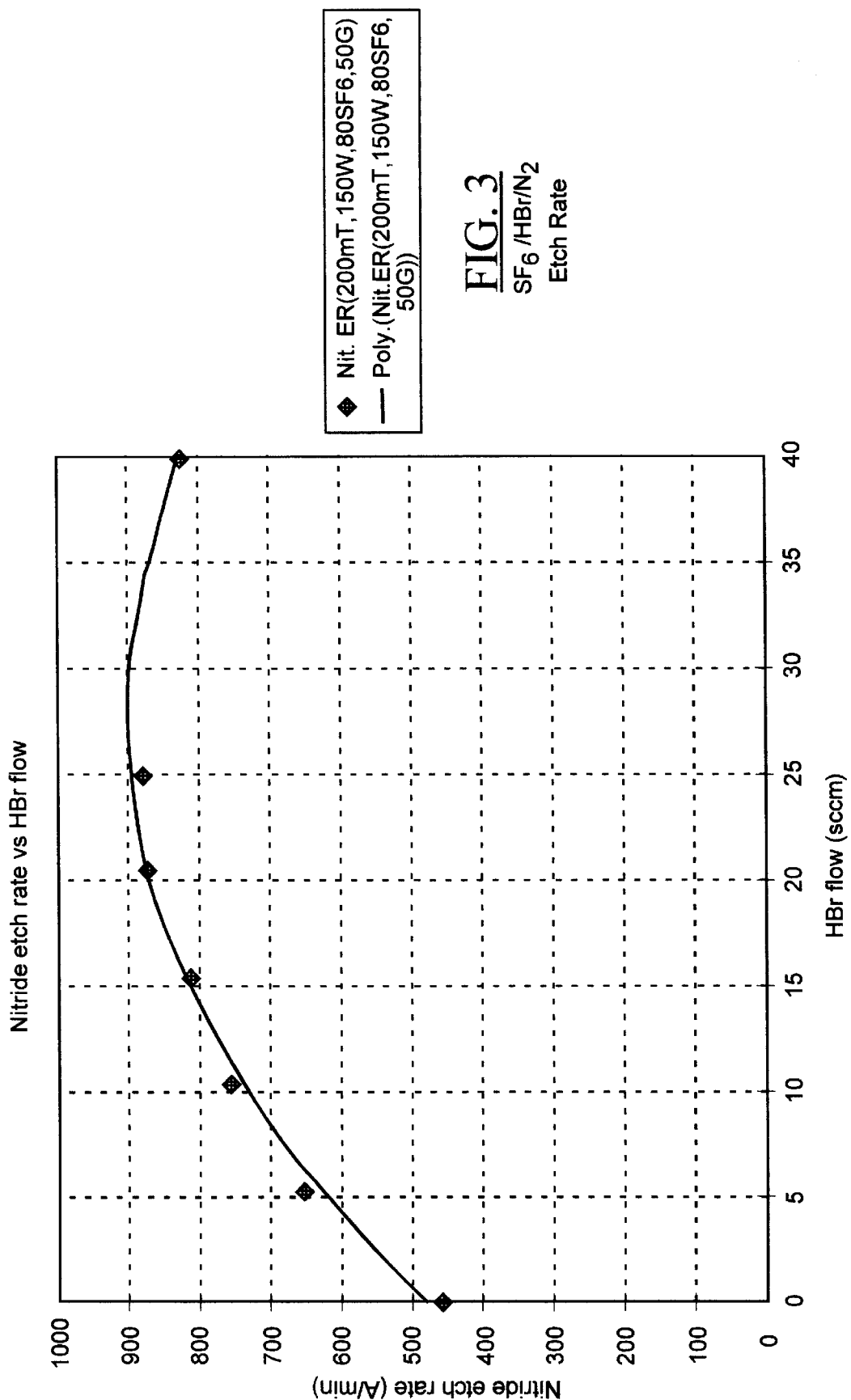
FIG. 3 is a plot showing second experimental results of SiN etch rate over a second range of plasma feed parameters for a $SF_6/HBr/N_2$ input gas recipe.

FIG. 3 is a plot showing second experimental results of SiN etch rate over a second range of plasma feed parameters for a $SF_6/HBr/N_2$ input gas recipe. Chamber pressure was set at 200 mTorr. EM input power was set at 150 Watts. The surface area of the exposed silicon nitride (135) was 325 $cm^2$ thereby providing a power density of 0.5 $W/cm^2$. EM frequency was set at 13.5 MHZ. HBr inflow rate was varied over the range 0 to 40 sccm. As seen the highest nitride etch rate was observed at about 27 sccm HBr. However, in FIG. 5, the 27 sccm HBr point correlates with relatively low selectivity for nitride. The range centering about 15 sccm HBr, and more generally extending between about 10 sccm HBr and about 20 sccm HBr is preferred because that range provides a combination of high selectivity (see FIG. 5) and good nitride etch rate (as seen by overlapping FIGS. 3 and 5).

Figure 4:
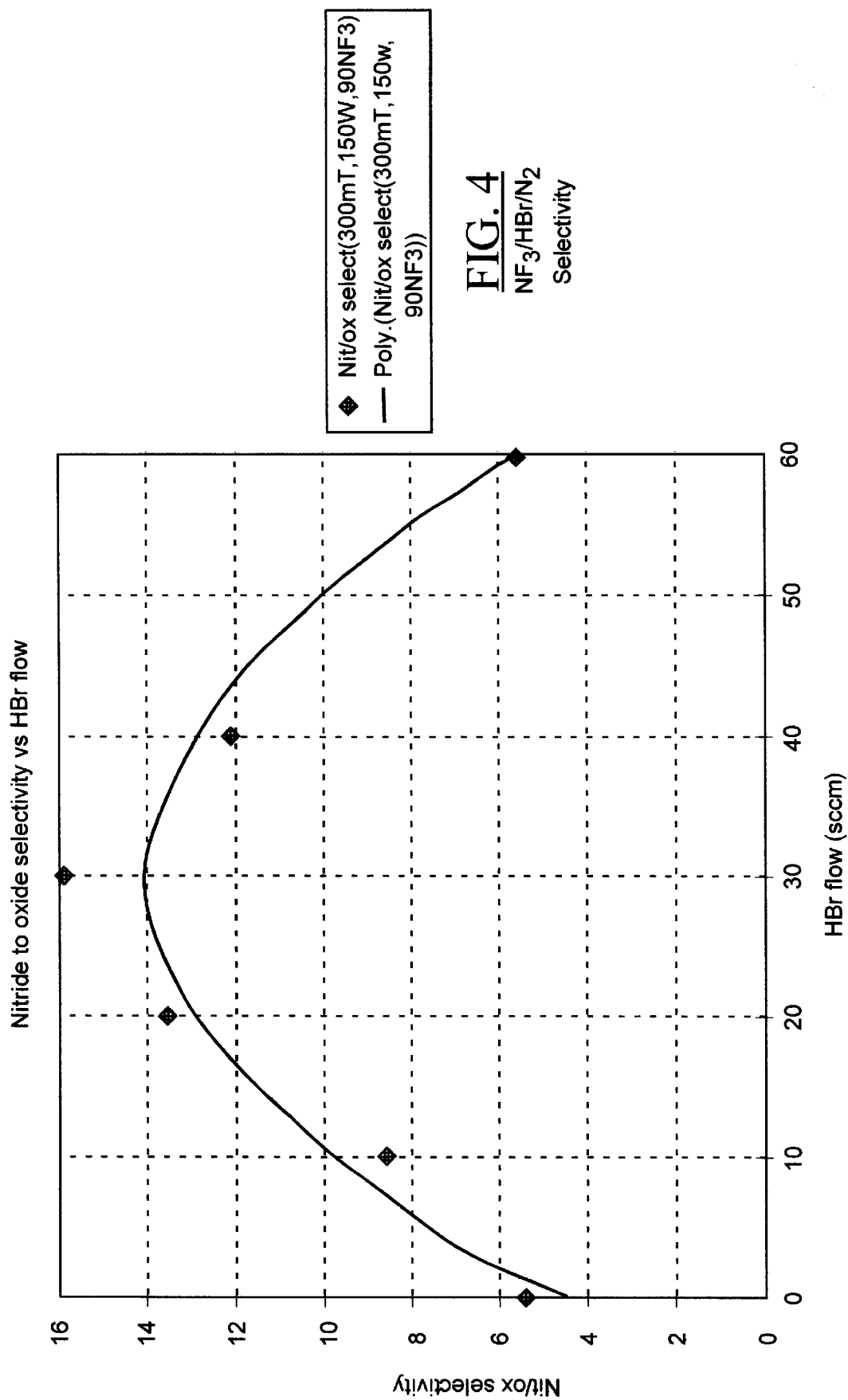
FIG. 4 is a plot showing first experimental results of SiN/SiO etch rate ratio over a range of HBr inflow rates for $NF_3/HBr/N_2$ input gas recipes.

FIG. 4, as already indicated, is a plot showing further experimental results of N/O_selectivity over a range of HBr feed rates for the $NF_3/HBr/N_2$ input gas recipe wherein $NF_3$ inflow rate was set to 90 sccm. Chamber pressure was set at 300 mTorr. EM input power was set at 150 Watts. The surface area of the exposed silicon nitride (135) was 325 $cm^2$ thereby providing a power density of approximately 0.5 $W/cm^2$. EM frequency was set at 13.5 MHZ. The diamond-shaped marks represent actual results while the curved solid line represents a least-squares, second order curve fitting among the six points shown.

Note in FIG. 4 that N/O_selectivity peaks at around 16:1 (actual result) with the HBr inflow rate set at about 30 scam. For N/O_selectivity greater than about 10:1, the HBr inflow rate set in the range of about 10 scam to 53 scam. For N/O_selectivity greater than about 12:1, the HBr inflow rate set in the range of about 15 scam to 45 scam. The best 3 out of the 6 test points occur when the HBr inflow rate was set in the range of about 20 scam to 40 scam. But as explained for FIG. 2, the higher nitride etch rates were observed in the range of 30 scam to 40 scam HBr thus making the upper half of the 20–40 scam HBr range more preferable. An HBr inflow rate of about 30 scam should be used when selectivity for nitride is considered more important than nitride etch rate. An HBr inflow rate of about 35 to 40 scam should be used when nitride etch rate is considered more important than selectivity for nitride.

In mass production systems where it is desirable to have both relatively high nitride etch rates and relatively high selectivity for nitride, good strategy is to adjust the recipe toward one that provides higher nitride etch rates while an upper bulk portion of the to-be-etched nitride layer (130) is being removed, and to thereafter re-adjust the recipe toward one that provides higher selectivity for nitride while a bottom minor portion of the to-be-etched nitride layer (130) is being removed. The latter adjustment helps to better protect the underlying silicon dioxide layer (120) from being excessively cut into. Such recipe adjustment and re-adjustment can be carried out automatically under control of a programmable computer. (Element 176 of FIG. 1 may be understood to be such a programmable computer and may be further understood to be operatively connected to so control gas source 150.)

High nitride etch rate and/or selectivity is not enough though. Good cross-wafer uniformity of nitride etch rate is also desirable, especially in the high etch rate favoring recipe, and even in the high nitride selectivity favoring recipe, because excessive cutting into the underlying silicon dioxide layer (120) at any spot on the wafer can result in significantly reduced yield of operable devices (e.g., properly functioning integrated circuits). As such, the cross-wafer uniformity results discussed later with respect to FIGS. 6 and 7 play a significant role in providing commercially useful recipes wherein excessive cutting into the underlying support layer (120) is inhibited uniformly across the wafer.

Figure 5:
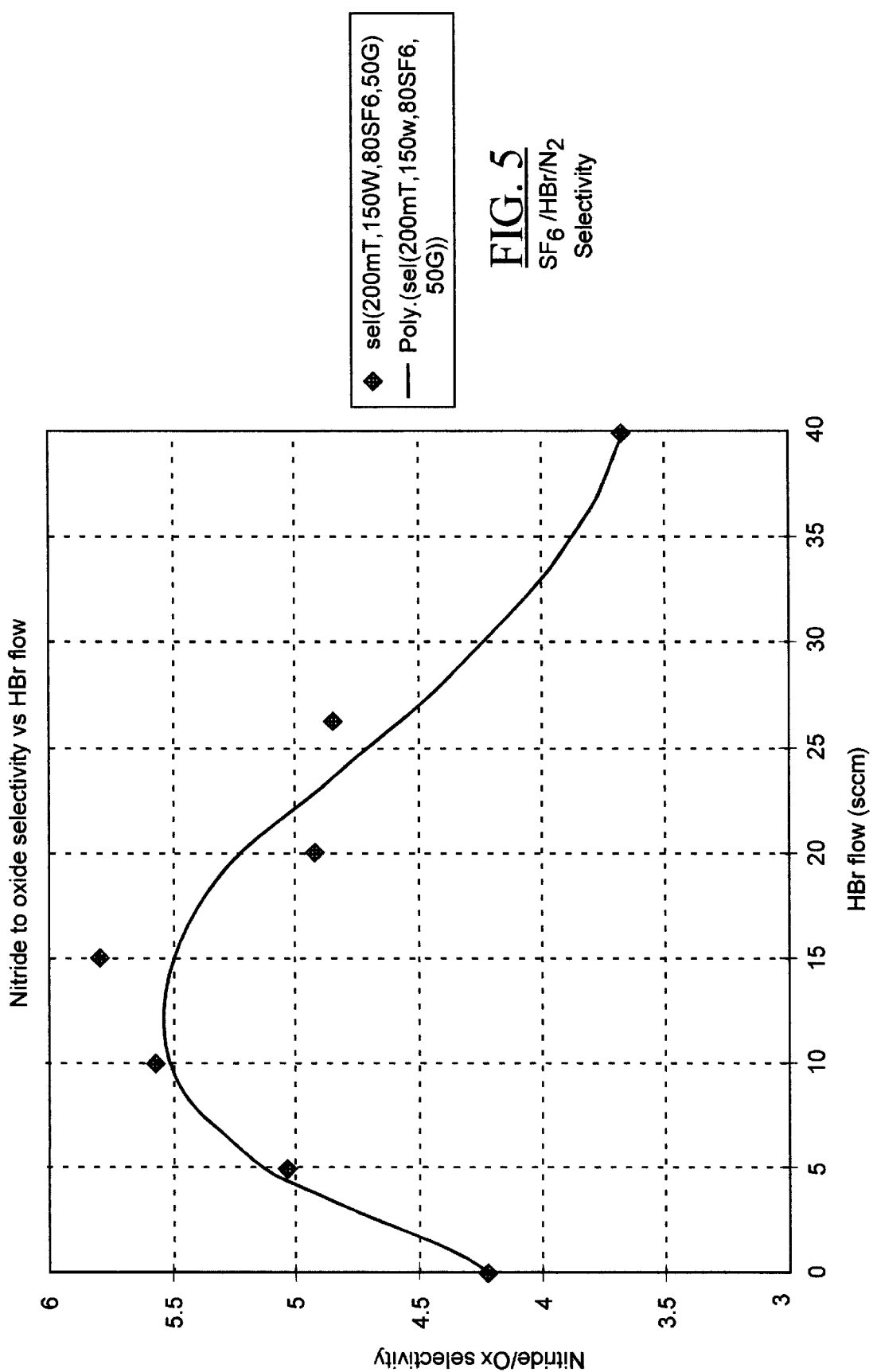
FIG. 5 is a plot showing second experimental results of SiN/SiO etch rate ratio over a range of HBr inflow rates for $SF_6/HBr/N_2$ input gas recipes.

FIG. 5, as already indicated, is a plot showing further experimental results of N/O_selectivity over a range of HBr feed rates for the $SF_6/HBr/N_2$ input gas recipe wherein $SF_6$ inflow rate was set to 80 sccm. Chamber pressure was set at 200 mTorr. EM input power was set at 150 Watts. The surface area of the exposed silicon nitride (135) was 325 $cm^2$ thereby providing a power density of 0.5 $W/cm^2$. EM frequency was set at 13.5 MHZ. The diamond-shaped marks represent actual results while the curved solid line represents a least-squares, second order curve fitting. $N_2$ inflow rate was fixed at 40 sccm. HBr inflow rate was varied over the range 0 to 40 sccm.

Note in FIG. 5 that N/O_selectivity peaks at around 5.8 to 1 (actual result) with the HBr inflow rate set at about 15 sccm. For N/O_selectivity greater than about 5:1, the HBr inflow rate should be set in the range of about 5 sccm to 20 sccm. The best 3 out of 7 points for FIG. 5 were observed when the HBr inflow rate was set in the range of about 5 sccm to 15 sccm.

Comparison of FIGS. 4 and 5 shows that the $NF_3/HBr/N_2$ input gas recipe has better N/O_selectivity than does the $SF_6/HBr/N_2$ input gas recipe.

In contrast, comparison of FIGS. 2 and 3 shows that the $SF_6/HBr/N_2$ recipe generally provides higher SiN etch rates in the HBr inflow range of between about 10 sccm to 40 sccm. (Note that the X-axis of FIG. 3 is not set at the same scale as the X-axis of FIG. 2. The results of FIG. 3 may be replotted over those of FIG. 2 to better see why the $SF_6/HBr/N_2$ recipe generally provides higher SiN etch rates in the range 10–40 sccm HBr.)

Given that for the same cost of HBr inflow in the range 10–40 sccm HBr, the $SF_6/HBr/N_2$ recipe generally provides higher SiN etch rates, it is preferable to use the $SF_6/HBr/N_2$ recipe while an upper bulk portion (e.g., the first 75% to 90%) of the to-be-etched nitride layer (130) is being removed.

Given that the $NF_3/HBr/N_2$ input gas recipe has better N/O_selectivity than does the $SF_6/HBr/N_2$ input gas recipe (in the range 10–40 scam HBr), it is preferable to use the $NF_3/HBr/N_2$ recipe while a lower minor portion (e.g., the last 10% to 25%) of the to-be-etched nitride layer (130) is being removed.

Use of the $SF_6/HBr/N_2$ recipe while the upper bulk portion (e.g., the first 75% to 90%) of the to-be-etched nitride layer (130) is being removed is further advantageous because the $SF_6/HBr/N_2$ input gas recipe provides a more anisotropic etch with less mask undercutting than does the $NF_3/HBr/N_2$ input gas recipe. This aspect will be explained with reference to FIGS. 8A–8C and 9. It should be noted that the combination of faster SiN etch rates and sharper profile is desirable while the upper bulk of the to-be-etched material layer 130 is being etched so that mask patterns are both quickly and accurately reproduced as the upper bulk portion (e.g., the first 75% to 90%) of the to-be-etched nitride layer (130) is being removed. On the other hand, higher selectivity is more desirable while the lowest minor portion of the to-be-etched material layer 130 (say the last 100 Å) is being etched down to the underlying layer (e.g., SiO) so that damaging over-etching into the underlying layer is minimized.

In accordance with one aspect of the invention therefore, the $SF_6/HBr/N_2$ recipe is used for its relatively faster SiN etch rates and more anisotropic etch properties while the upper bulk of the to-be-etched material layer 130 is being etched and the $NF_3/HBr/N_2$ input gas recipe is subsequently used in the same process chamber for its better N/O_ selectivity while the lowest minor portion of the to-be-etched material layer 130 (e.g., the last 100 Å) is being etched. In both cases, good cross-wafer uniformity of etch rate is desired so that when the lowest minor portion of the to-be-etched material layer 130 is reached, the thickness of the to-be-etched material is relatively uniform across the wafer and so that the final etch-through is carried out at uniform etch rates across the workpiece (wafer).

In one embodiment, the workpiece is a substantially disc-shaped silicon wafer having an 8 inch major diameter. On the wafer, a 1500 Å thick SiN layer is overlaid on a 100 Å to 300 Å thick SiO padding layer. The SiO padding layer protects an underlying monocrystalline silicon layer. During mass production stripping off of the SiN material (which stripping is carried out after thick field oxide has been grown in specific parts of the wafer), it is desirable to have at least 30 Å to 40 Å of the SiO padding remaining at all points across the workpiece surface after the SiN stripping operation completes. As the SiN stripping operation approaches end point (e.g., the last 150 Å of the SiN layer), the recipe is adjusted to maximize nitride versus oxide selectivity and cross-wafer uniformity, even at the expense of having lower etch rate (and thus longer production time). This is done to assure that the minimum of 30 Å to 40 Å of SiO padding is left at all points across the workpiece surface after all the SiN has been stripped away. In this situation, end-point etch-rate uniformity is preferably be 9% or less across the wafer using 1 sigma statistical sampling criteria.

Figure 6:
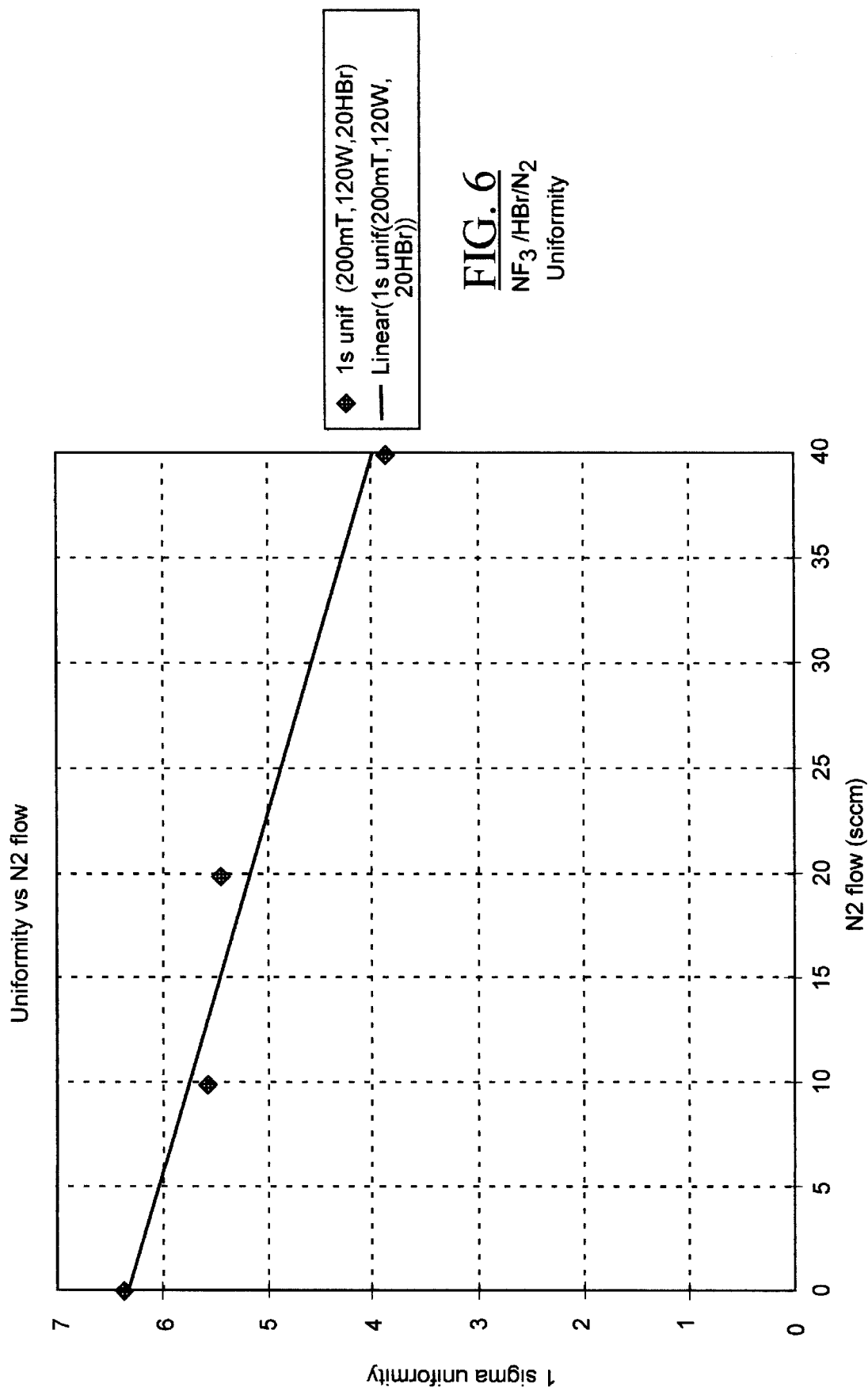
FIG. 6 is a plot showing experimental results of cross-wafer nitride-etch uniformity over a range of $N_2$ inflow rates for $NF_3/HBr/N_2$ input gas recipes.

FIG. 6 is a plot showing experimental results of cross-wafer nitride-etch uniformity over a range of $N_2$ inflow rates for the $NF_3/HBr/N_2$ input gas recipe. $NF_3$ inflow rate was set to 90 sccm. HBr inflow rate was set to 20 sccm. Chamber pressure was set at 200 mTorr. EM input power was set at 120 Watts. The surface area of the exposed silicon nitride (135) was 325 $cm^2$ thereby providing a power density of roughly 0.4 $W/cm^2$. EM frequency was set at 13.5 MHZ. The diamond-shaped marks represent actual results while the straight solid line represents a least-squares first order fitting.

Note in FIG. 6 that cross-wafer uniformity of nitride etching improves with increase of the $N_2$ inflow rate. For cross-wafer nitride etch-rate uniformity of about 6% or less, the $N_2$ inflow rate should be set to about 7.5 sccm or more. For a better cross-wafer nitride etch-rate uniformity of about 5% or less, the $N_2$ inflow rate should be set to about 25 sccm or more. For an even better cross-wafer nitride etch-rate uniformity of about 4% or less, the $N_2$ inflow rate should be set to about 40 sccm or more.

Figure 7:
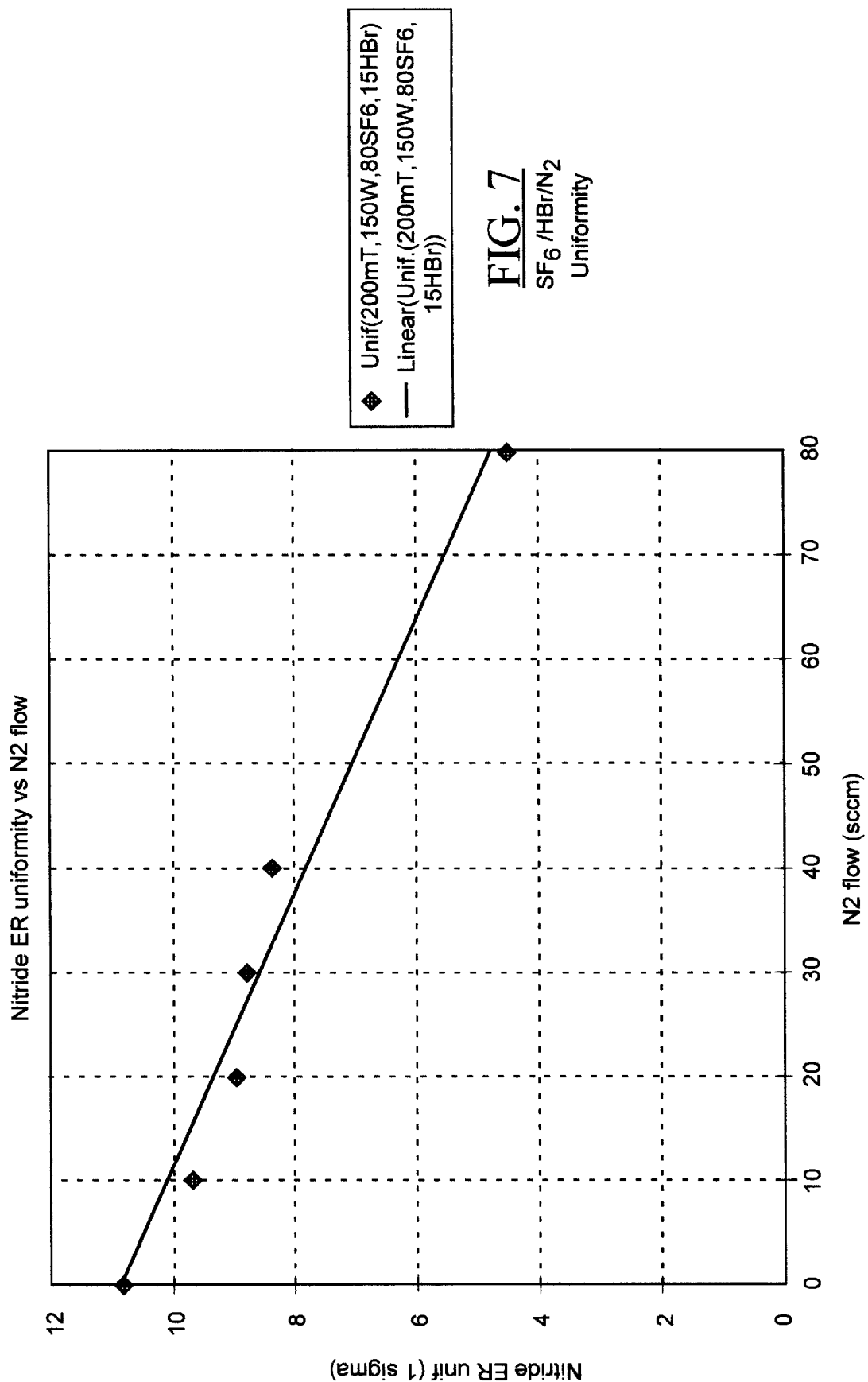
FIG. 7 is a plot showing experimental results of cross-wafer nitride-etch uniformity over a range of $N_2$ inflow rates for $SF_6/HBr/N_2$ input gas recipes.

FIG. 7 is a plot showing experimental results of cross-wafer nitride-etch uniformity over a range of $N_2$ inflow rates for the $SF_6/HBr/N_2$ input gas recipe. $SF_6$ inflow rate was set to 80 sccm. HBr inflow rate was set to 15 sccm (the maximum selectivity point of FIG. 5). Chamber pressure was set at 200 mTorr. EM input power was set at 150 Watts. The surface area of the exposed silicon nitride (135) was 325 $cm^2$ thereby providing a power density of 0.5 $W/cm^2$. EM frequency was set at 13.5 MHZ. The diamond-shaped marks represent actual results while the straight solid line represents a least-squares first order fitting.

Note in FIG. 7 that cross-wafer uniformity of nitride etching improves with increase of the $N_2$ inflow rate. For cross-wafer nitride-etch rate uniformity (using a 1 sigma sampling error criteria) of about 10% or less, the $N_2$ inflow rate should be set to about 10 sccm or more. For a better cross-wafer nitride-etch rate uniformity of about 8% or less, the $N_2$ inflow rate should be set to about 40 sccm or more. For an even better cross-wafer nitride etch-rate uniformity of about 5% or less, the $N_2$ inflow rate should be set to about 80 sccm or more.

Figure 8A:
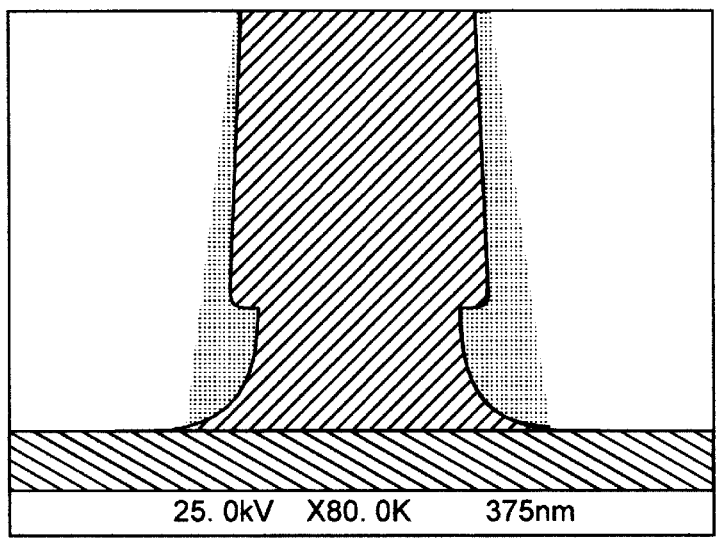
FIGS. 8A–8C are micrographs showing cross sectional views of step features obtained with a respective three different variations of the $NF_3/HBr/N_2$ input gas recipe.
Figure 8B:
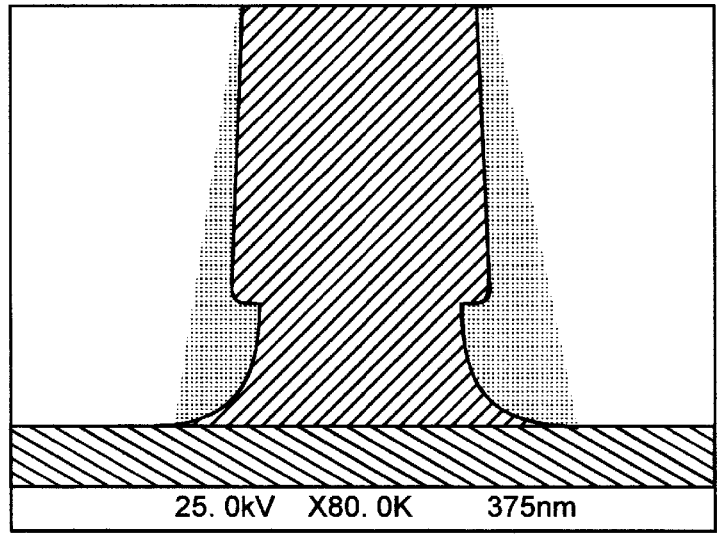
Figure 8C:
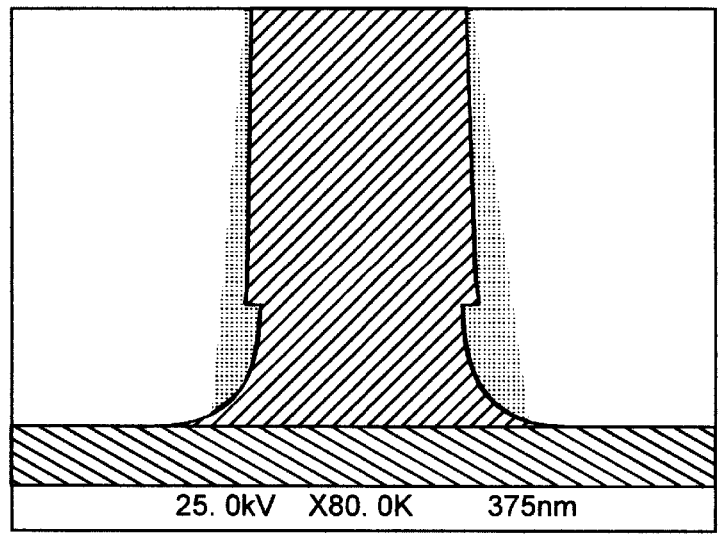

FIGS. 8A–8C are micrographs showing cross sectional views of step features obtained with a respective three different variations of the $NF_3/HBr/N_2$ input gas recipe. In each of FIGS. 8A–8C, $NF_3$ inflow rate was set to 45 sccm. Chamber pressure was set at 200 mTorr. EM input power was set at 120 Watts. Wafer backside temperature was held at 40° C. A magnetic confinement field of 30 Gauss (30G) was used. The surface area of the exposed silicon nitride (135) was 325 $cm^2$ thereby providing a power density of 0.4 $W/cm^2$. EM frequency was set at 13.5 MHZ.

In FIG. 8A, HBr inflow rate was additionally set to zero. $N_2$ inflow rate was further set to zero. As a result, etching was entirely by action of the $NF_3$. Mask undercutting is seen at the position where the two silicon nitride sidewalls curve up from the SiN floor level to meet the wider mask material.

In FIG. 8B, HBr inflow rate was increased to 20 sccm. $N_2$ inflow rate continued at zero. Significant mask undercutting is still seen at the place where the two nitride sidewalls curve up to meet the wider mask material.

FIG. 8C, HBr inflow rate was returned to zero and $N_2$ inflow rate was increased to 40 sccm. The etch recipe was therefore primarily $NF_3/N_2$. As seen, mask undercutting is significantly reduced compared to each of FIGS. 8A and 8B. This difference is specifically seen at the place where the two nitride sidewalls curve up to meet the slightly wider mask material in FIG. 8C. In each of the cases of FIGS. 8A–8C the same mask pattern was used and the same starting workpiece configuration was used.

It is believed that a chemically different residue material develops in FIG. 8C around the sidewalls of the silicon nitride when significant $N_2$ inflow (e.g., 40 sccm) is present in the recipe and that this chemically different residue protects the SiN sidewalls from being sidecut during the etch process.

The primary difference between FIG. 8C and FIG. 8A is that the 40 sccm inflow of $N_2$ is added to the process recipe of FIG. 8A. This addition of substantial inflow of $N_2$ is believed to be responsible for the reduction in mask undercutting.

Accordingly, when anisotropic etching (with less mask undercutting and sharper step profiles) is desired, it is advantageous to include a substantial inflow of $N_2$ in the silicon nitride etching recipe.

Figure 9A:
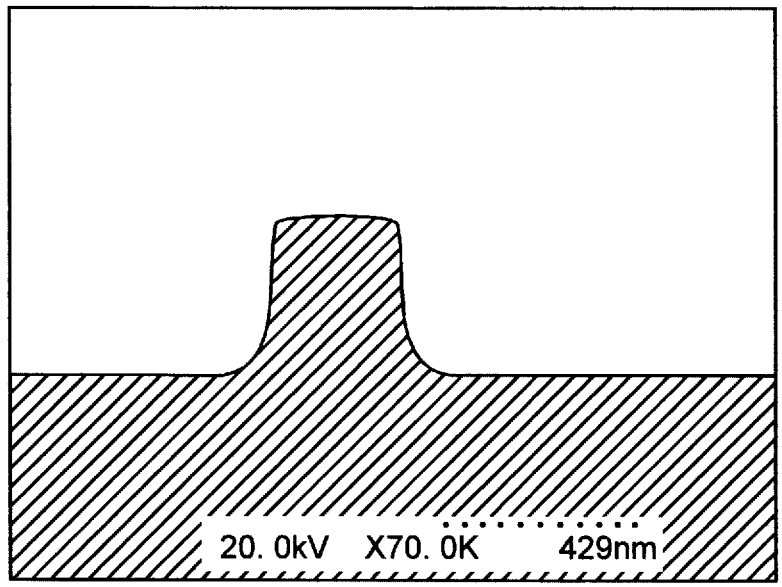
FIGS. 9A–9B are micrographs respectively showing a cross sectional view of sharp step profile feature obtained with a $SF_6/HBr/N_2$ end-point gas recipe at the center of the wafer and at the edge of the wafer.
Figure 9B:
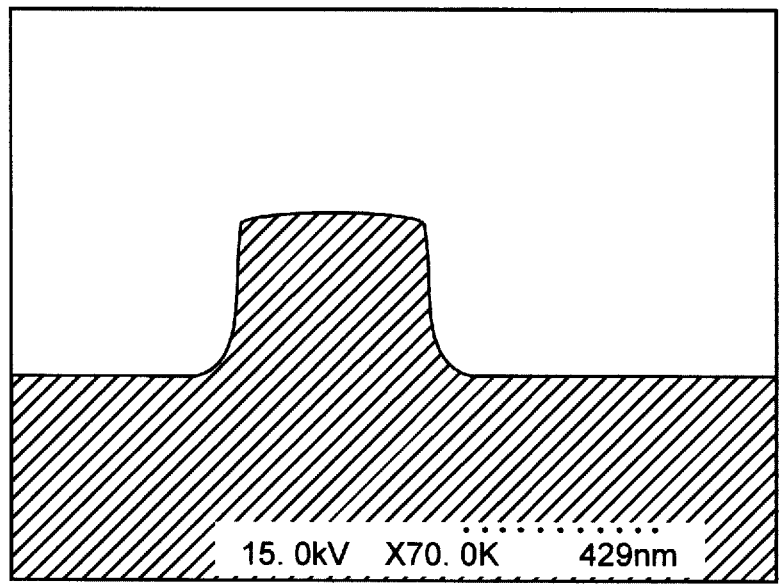

Referring to FIGS. 9A and 9B, these respectively show resulting profiles at wafer-center and wafer-edge. The recipe used to produce these results included a main, bulk etch using only $SF_6$ inflowing at 80 sccm with a chamber pressure of 10 mTorr, EM power of 300 W, a magnetic confinement field of 80 Gauss, and a cathode temperature of 40° C. This was followed by an end-point terminated over-etch using the following recipe: $SF_6$ inflowing at 80 sccm in combination with 15 HBr at 15 sccm and $N_2$ at 80 sccm. The other parameters for the end-point etch were: 200 mTorr, 150 W, 50 Gauss, and 40° C.

It is seen from FIGS. 9A and 9B that the $SF_6$/HBr/$N_2$ end-point recipe provides consistent etch depth at both the wafer center (FIG. 9A) and wafer edge (FIG. 9B) with no observable mask undercutting. This is to be contrasted with the less anisotropic etching of FIG. 8B wherein the utilized $NF_3$/HBr recipe does create observable mask undercutting.

The above disclosure is to be taken as illustrative of the invention, not as limiting its scope or spirit. Numerous modifications and variations will become apparent to those skilled in the art after studying the above disclosure.

Given the above disclosure of general concepts and specific embodiments, the scope of protection sought is to be accordingly defined by the claims appended hereto.

What is claimed is:

1. A selective etching method for providing substantially uniform etching of silicon nitride material provided across a surface of a supplied workpiece, the workpiece surface having a span of at least 6 inches, said method being such that deviation of etch depth across the span of the workpiece surface is substantially equal to or less than 10 percent, said method comprising the steps of:
   (a) flowing an input gas including:
      (a.1) at least one of $NF_3$ and $SF_6$,
      (a.2) HBr, and
      (a.3) $N_2$
   into a low-pressure chamber containing said workpiece;
   (b) maintaining a pressure of 300 milliTorr or less in said chamber; and
   (c) applying electromagnetic energy to the supplied input gas so as to form a plasma;
      (a.3.i) wherein the inflow rate of the $N_2$ is equal to or greater than 10 sccm.
2. An etching method according to claim 1 wherein:
   (a.3.ii) the inflow rate of the $N_2$ is equal to or greater than 20 sccm.
3. An etching method according to claim 2 wherein:
   (a.3.iii) the inflow rate of the $N_2$ is equal to or greater than 40 sccm.
4. An etching method according to claim 1 wherein:
   (a.1.i) said input gas includes $SF_6$, and
   (a.2.i) the inflow rate of the HBr is in the range of about 5 to 15 sccm.
5. An etching method according to claim 4 wherein:
   (a.1.ii) the inflow rate of the $SF_6$ is about 80 sccm, and
   (a.2.ii) the inflow rate of the HBr is about 15 sccm.
6. An etching method according to claim 1 wherein:
   (a.1.i) said input gas includes $NF_3$, and
   (a.2.i) the inflow rate of the HBr is in the range of about 20 to 40 sccm.
7. An etching method according to claim 6 wherein:
   (a.1.ii) the inflow rate of the $NF_3$ is about 90 sccm, and
   (a.2.ii) the inflow rate of the HBr is about 30 sccm.
8. An etching method according to claim 1 wherein:
   said supplied workpiece includes silicon oxide adjacent to the silicon nitride material.
9. An etching method according to claim 8 wherein said silicon oxide has a thickness of 100 Å or less.
10. An etching method according to claim 1 wherein in a first phase of etching said input gas consists essentially of $SF_6$ and HBr and $N_2$.
11. An etching method according to claim 10 wherein in a second phase of etching said input gas consists essentially of $NF_3$ and HBr and $N_2$.
12. An etching method according to claim 11 wherein the second phase of etching occurs after the first phase of etching and wherein final etch-through is achieved in the second phase.
13. An etch method according to claim 1 further comprising the step of:
   (d) providing a mask layer over the silicon nitride material, the mask layer having one or more apertures defined through the mask layer for exposing a corresponding one or more prespecified surface portions of the silicon nitride material.
14. A system for etching-through a material layer consisting essentially of silicon nitride, said system comprising:
   (a) a chamber for supporting the material layer there within;
   (b) supply means for supplying a input-gas containing at least one of $NF_3$ and $SF_6$, and further containing HBr and $N_2$ into the chamber, said $N_2$ having an inflow rate of at least 10 sccm;
   (c) vacuum means for maintaining a pressure at least as low as approximately 300 milliTorr within the chamber; and
   (d) electromagnetic energy generator means for supplying electromagnetic energy into the chamber and thereby reacting said input-gas with the material layer supported within the chamber.

* * * * *